United States Patent
Loeda et al.

(10) Patent No.: US 8,284,086 B2
(45) Date of Patent: Oct. 9, 2012

(54) DEVICE AND METHOD FOR THE TRANSMISSION AND RECEPTION OF HIGH FIDELITY AUDIO USING A SINGLE WIRE

(75) Inventors: Sebastian Loeda, Edinburgh (GB); Gary Hague, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 112 days.

(21) Appl. No.: 12/928,867

(22) Filed: Dec. 21, 2010

(65) Prior Publication Data
US 2012/0139768 A1    Jun. 7, 2012

(30) Foreign Application Priority Data
Dec. 1, 2010   (EP) .................................... 10015173

(51) Int. Cl.
H03M 3/00    (2006.01)
(52) U.S. Cl. ......................... 341/143; 375/245
(58) Field of Classification Search .................. 341/143; 375/245, 257, 260, 238, 345, 360, 370
See application file for complete search history.

(56) References Cited

U.S. PATENT DOCUMENTS

| | | | |
|---|---|---|---|
| 6,606,044 B2 | 8/2003 | Roeckner et al. | |
| 6,683,548 B2 | 1/2004 | Scott et al. | |
| 7,130,346 B2 | 10/2006 | Midya et al. | |
| 7,391,280 B2 | 6/2008 | Hsu | |
| 7,667,552 B2 | 2/2010 | Midya et al. | |
| 7,782,129 B2 * | 8/2010 | Mallinson et al. | 330/10 |

OTHER PUBLICATIONS

European Search Report, Dialog Semiconductor GmbH, 1001517307-1233, Mail date—May 30, 2011.
"A/D Conversion Using Asynchronous Delta-Sigma Modulation and Time-to-Digital Conversion," by Jorg Daniels et al., IEEE Transactions on Circuits and Systems—1: Regular Papers, vol. 57, No. 9, Sep. 2010, pp. 2404-2412.
"Is the AESEBU / SPDIF Digital Interface Flawed?," by Chris Dunn and Malcolm Hawksford, 93rd AES Convention, San Francisco 1992, preprint 3360, pp. 1-36.

* cited by examiner

Primary Examiner — Joseph Lauture
(74) Attorney, Agent, or Firm — Saile Ackerman LLC; Stephen B. Ackerman

(57) ABSTRACT

An audio device (200) includes a first and second ICs (210) and (250) and a substrate (205). The first IC includes a sigma-delta, A/D converter (218) operable to convert an analog signal (234) into a pulse density modulated signal (236). A pulse density width modulator encoder (222) is operable to encode the PDM signal into a PDWM signal (244). The PDWM has short and long pulse widths defining first and second bit levels. The leading edges of each pulse bounds each pulse period. The second IC (250) includes a means (254) to receive the PDWM signal, an edge detector (304) operable to detect the leading pulse edges of the PDWM signal, a time-averaging circuit (308) operable to calculate each pulse period from the leading pulse edges and to generate a sample pulse (120) at near the midpoint of each pulse period, and a latch (312) operable to sample and hold the PDWM signal at the sample pulse to decode a PDM signal (278). The substrate is operable to support the first and second ICs and to conduct the PDWM signal between the first and second ICs.

25 Claims, 4 Drawing Sheets

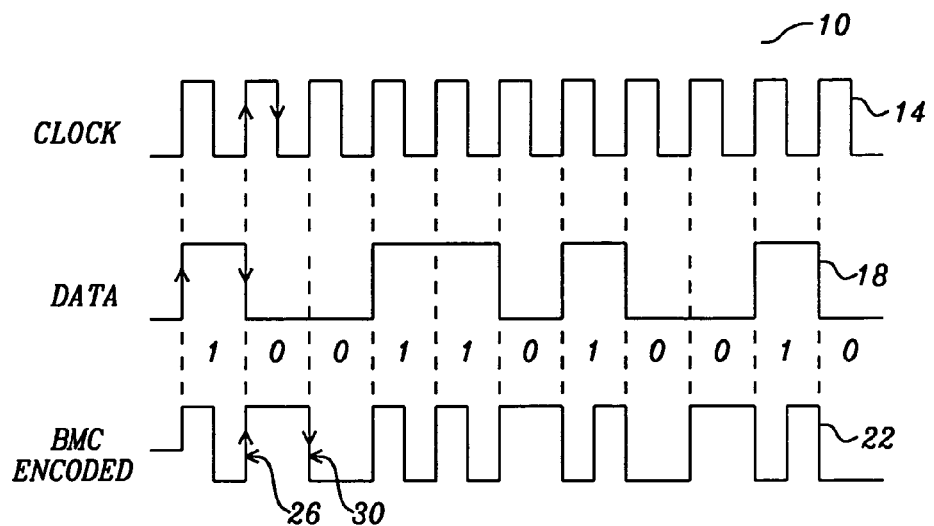
FIG. 1 - Prior Art
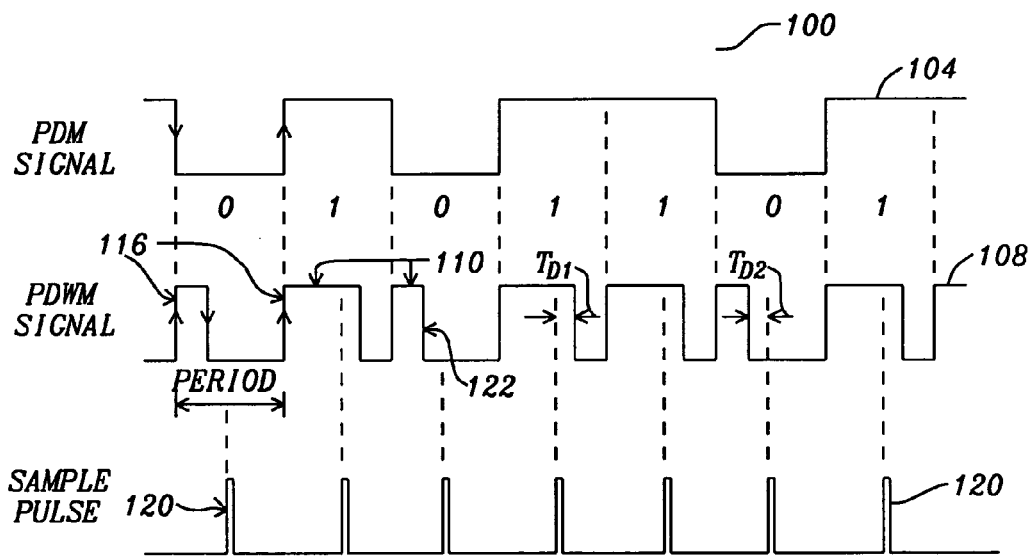
FIG. 2

DEVICE AND METHOD FOR THE TRANSMISSION AND RECEPTION OF HIGH FIDELITY AUDIO USING A SINGLE WIRE

FIELD OF THE INVENTION

The invention relates generally to audio devices and, more particularly, to encoding methods for transmitting and receiving high-fidelity audio signals between audio device circuits.

BACKGROUND OF THE INVENTION

The human ear is very sensitive to noise and particularly sensitive to distortion in audio signals. For example, to maintain auditory purity, a high fidelity (HIFI) audio signal must be transmitted, encoded, decoded, and reproduced with a very high dynamic range (100 to 120 dB) and carry very little distortion (−90 to −110 dB). This level of fidelity is particularly challenging in situations where the audio signal must be transmitted between two audio integrated circuits (ICs) resident on a compact and densely populated printed circuit board (PCB). Under such conditions, a transmitted HIFI audio signal is subject to substantial noise and interference. Further, tight PCB layouts make it very difficult to isolation the HIFI signal from interference using spacing, routing, and grounding techniques.

An effective method of transmission of HIFI audio signals on a densely-populated PCB should have little or no loss of signal quality, should not be sensitive to an interfering medium, and should minimize the introduction of interference. In addition, if a transmission protocol is used, then the protocol should require minimal circuit overhead on the interconnected IC devices and should be flexible. From a PCB routing standpoint, the smallest HIFI audio signal overhead is achieved by transmitting the signal over a single wire. However, single wire transmission is very susceptible to noise pickup and must be very well isolated from other PCB conductors. The necessary isolation distances and grounding make single wire transmission of analog HIFI audio signals unsuitable for compact and densely populated PCBs. As an alternative, analog HIFI audio may be transmitted across the PCB via differential signals. This approach improves noise rejection. However, differential signals require at least two wires and increase the area used.

As an alternative, HIFI audio signals may be transmitted in a pulse width modulated (PWM) form. A variable width pulse is transmitted where the width of each pulse encodes a sampled value of the amplitude of the audio signal for that pulse period. A PWM signal may be transmitted on a single wire, is easily decoded at the receiver with a low-pass filter, and is more robust to amplitude interference. However, a PWM signal is sensitive to mismatch in the rise and fall time constraints of its pulse. A differential form of the PWM signal would resolve the mismatch issue but requires more than one wire.

A most robust transmission method is to encode a HIFI audio signal into a digital signal, transmit this signal across the PCB channel, and then decode the signal back into an analog signal. Digitally encoded amplitude information may be perfectly transmitted, received, and decoded. However, a clock is necessary to reproduce the HIFI audio signal from the digital signal at the receiving end. In addition, if there is any jitter on this clock, then this jitter will adversely affect the quality of the sound reproduced. To prevent clock jitter, the transmitted signal must be isolated from environmental amplitude noise or interference that is converted into edge timing errors through the slope of the clock pulse.

Typically, HIFI audio signals are encoded as either 20-bit, 24-bit, or 32 bit words transmitted at rates of either 48 KHz or 44.1 KHz. An exemplary protocol, like I$^2$S, is capable to transmits digitally encoded, HIFI audio as serialized digital audio words. However, I$^2$S is not particularly useful for densely packed PCB application because the physical layer requires separate data, word clock, and bit clock lines. Further, the I$^2$S scheme requires a large overhead for both transmitting and receiving ICs.

Another proposed solution for transmitting HIFI audio signals via digital encoding is the Sony/Philips Digital Interconnect Format (SPDIF). In the SPDIF scheme, an analog signal is encoded as a series of digital words. These digital words are transmitted in a single-bit stream with unique headers marking the start of each word. A decoding clock is mixed into the data stream using bi-phase mark code (BMC). This clock must later be recovered from the BMC stream, typically by using a phase-locked loop (PLL), so that the clock may be used to reproduce the audio signal via a digital-to-analog converter (DAC) at the receiving end. The SPDIF physical layer may be implemented as a single wire. However, this protocol requires significant overhead for transmitting and receiving circuits, plus a PLL, a serialization circuit, a deserialization circuit, and a decoder.

In addition to the large overhead requirements, another major issue reported with the SPDIF format is that the clock introduced in the BMC encoding is effectively modulated by the transmitted audio data. Referring now to FIG. 1, a timing diagram 10 of the operation of the prior art SPDIF audio data transmission scheme is shown. In the SPDIF protocol, the CLOCK 14 and DATA 18 are combined to form the BMC ENCODED signal 22. The BMC ENCODED signal 22 includes positive transitions that are are triggered at the rising edge of the CLOCK 14 if the DATA 18 is a series of consecutive logical "1's." However, the BMC ENCODED signal 22 is triggered at alternating edges if the DATA is a series of consecutive logical "0's."

It has been found that the rising edges 26 and falling edges 30 of the BMC ENCODED signal 22 are inevitably mismatched. This mismatch effects the clock signal that is recovered from the BMC ENCODED signal when it is decoded by the receiving IC. In particular, clock jitter (more precisely, aperture jitter) is introduced. Further, this clock jitter is dependent on the encoded audio signal. As a result, when the received BMC ENCODED signal 22 is decoded and reproduced by a digital-to-analog converter (DAC), the HIFI audio is audibly effected. The jitter effect can be heard as poor quality audio. The same problem arises if only the positive edges (or only the negative edges) of the BMC ENCODED signal 22 are detected. The same problem arises if Manchester encoding is used. In addition, a single line transmitting HIFI audio using the SPDIF protocol and physical layer will emit electromagnetic interference (EMI). Tones are found to be emitted from the signal line at frequencies other than the audio content. Further, it is found that adjacent SPDIF lines (as might be the case in a stereo application) are susceptible to crosstalk between the signals and to signal distortion. Although actual digital data errors are highly unlikely, this crosstalk effect is found to be audible in the recovered audio signal due to coupling of signal content onto the recovered clock. For this reason, signal lines carrying SPDIF-encoded content must typically be shielded for HIFI applications.

Another method of transmitting audio data is pulse density modulation (PDM). For example, a single-bit, analog-to-digital converter (ADC) may be used to convert an analog signal into an over-sampled single bit stream. With sufficient oversampling and quantization noise shaping, an audio signal may be transmitted with high fidelity over a single wire. The PDM signal may then be decoded using a digital-to-analog converter (DAC) at the receiving end. Since the analog data is encoded in the PDM signal as a single-bit stream, no digital word synchronization or serialization is required. In asynchronous PDM (APDM), the encoding clock is recovered from the transmitted PDM data using a PLL, as is the case with SPDIF. Unfortunately, APDM encoding suffers the same problems of signal modulation onto the recovered clock as found in the BMC encoding or Manchester encoding. A stereo PDM (SPDM) scheme may be used to resolve the issue by supplying the clock separately. However, this scheme will not work with a single wire.

It is therefore very useful to provide a method and device for transmitting HIFI audio signals over a single wire. In the present invention, a novel and robust method to transmit HIFI content over a single wire is described. The invention allows high-fidelity audio signals to be transmitted and received on a printed circuit board via a single wire. The present invention eliminates data modulation of the system clock and minimizes signal-dependent EMI. In addition, the spectrum of signal-related transitions does not include frequency multiples of the audio signal. Further, the present invention eliminates the need for header synchronization. Finally, the invention improves PCB signal routing flexibility while removing the need for a PLL circuit.

BRIEF DESCRIPTION OF THE DRAWINGS

The present invention and the corresponding advantages and features provided thereby will be best understood and appreciated upon review of the following detailed description of the invention, taken in conjunction with the following drawings, where like numerals represent like elements, in which:

FIG. 1 is a timing diagram of the operation of a prior art SPDIF audio data transmission scheme;

FIG. 2 is a timing diagram illustrating one example of a method for transmitting and receiving analog data in accordance with one embodiment of the invention;

DETAILED DESCRIPTION OF THE INVENTION

Figure 3:
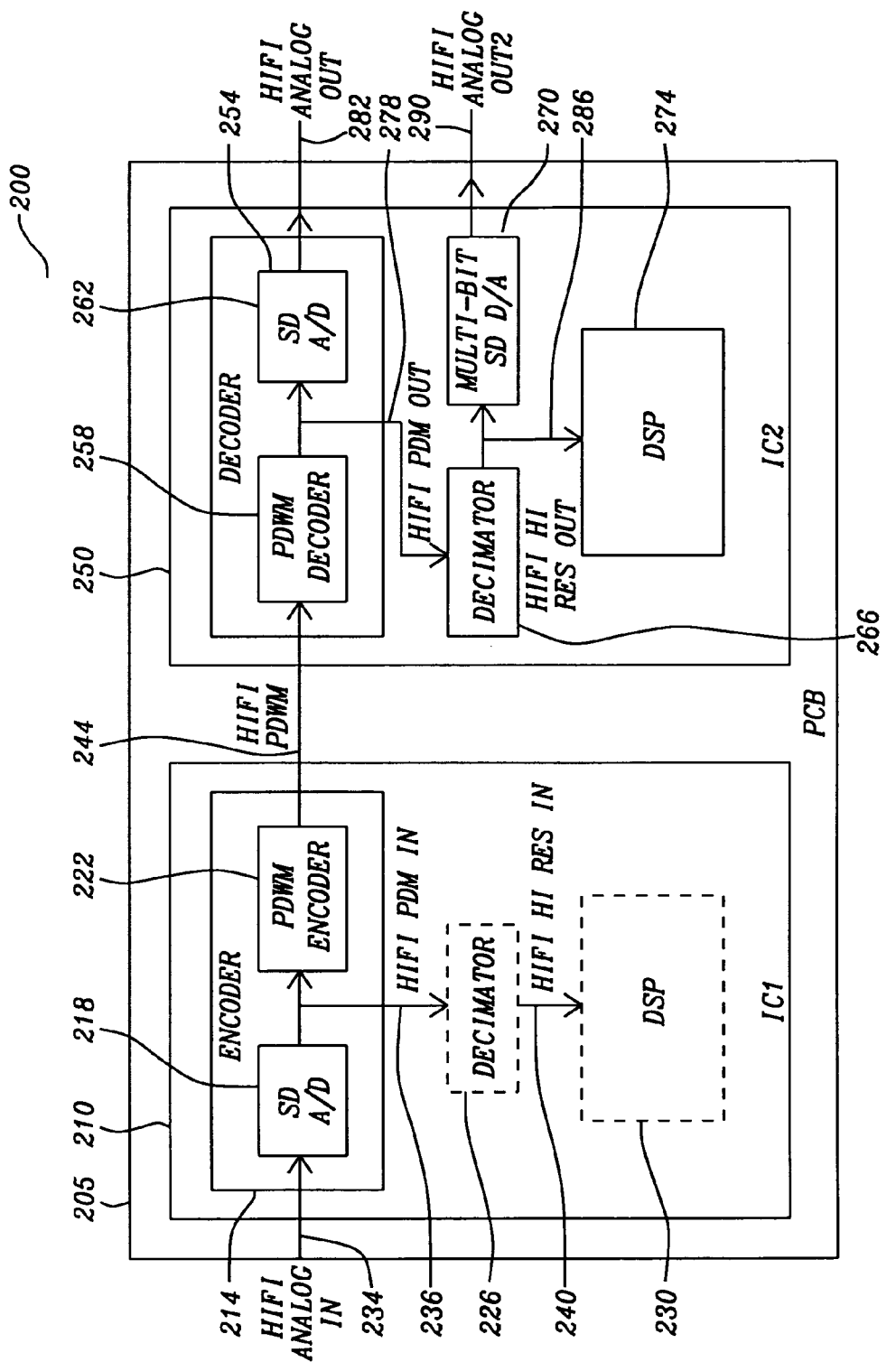
FIG. 3 is a schematic block diagram illustrating one example of an audio device incorporating the method of transmitting and receiving analog data in accordance with one embodiment of the invention.

A novel method and device provides improved performance in the transmissions and reception of analog signals and, more particularly, high fidelity audio signal. The method and device provide these improvements by, among other things, encoding an analog signal as a pulse density width modulated signal that is more robust for transmission, reception, and recovery. In an exemplary embodiment of the present invention, a method for encoding an analog signal receives an analog signal, converts the analog signal into a pulse density modulated signal by sigma-delta, analog-to-digital conversion, and encodes the pulse density modulated signal into a pulse density width modulated signal. A plurality of discrete pulse widths corresponds to a plurality of pulse density modulated signal bit levels. A leading edge of each pulse bounds each pulse period.

In another exemplary embodiment of the present invention, a method for decoding a pulse density modulated signal from a pulse density width modulated signal receives a pulse density width modulated signal, detects the leading pulse edges of the pulse density width modulated signal, calculates the pulse period from the leading pulse edges, generates a sample pulse at near the midpoint of the pulse period, and samples and holds the pulse density width modulated signal at the sample pulse to decode a pulse density modulated signal.

In another exemplary embodiment of the present invention, a device is enabled for sending an encoded analog signal. The device includes a sigma-delta, A/D converter operable to convert an analog signal into a pulse density modulated signal, a pulse density width modulation encoder operable to encode the pulse density modulated signal into a pulse density width modulated signal having short and long pulse widths defining first and second bit levels and leading edges bounding each pulse period.

In another exemplary embodiment of the present invention, a device is enabled for receiving an encoded analog signal. The device includes a means to receive a pulse density width modulated signal, an edge detector operable to detect the leading pulse edges of the pulse density width modulated signal, a time-averaging circuit operable to calculate each pulse period from the leading pulse edges and to generate a sample pulse at near the midpoint of the pulse period, and a latch operable to sample and hold the pulse density width modulated signal at the sample pulse to decode a digital, pulse density signal.

In another exemplary embodiment of the present invention, an audio device includes a first integrated circuit, a second integrated circuit, and a substrate. The first integrated circuit includes a sigma-delta, A/D converter operable to convert an analog signal into a pulse density modulated signal and a pulse density width modulator operable to encode the pulse density modulated signal into a pulse density width modulated signal having short and long pulse widths defining first and second bit levels and leading edges of each pulse bounding each pulse period. The second integrated circuit includes a means to receive the pulse density width modulated signal, an edge detector operable to detect the leading pulse edges of the pulse density width modulated signal, a time-averaging circuit operable to calculate each pulse period from the leading pulse edges and to generate a sample pulse at near the midpoint of each pulse period, and a latch operable to sample and hold the pulse density width modulated signal at the sample pulse to decode a pulse density modulated signal. The substrate is operable to support the first and second integrated circuits and to conduct the pulse density width modulated signal between the first and second integrated circuits.

As such, a novel device and method are disclosed that provides improved transmission and reception of high fidelity audio signals between devices on a substrate. In particular, the pulse density width modulation (PDWM) scheme allows high-fidelity audio signals to be transmitted and received on a printed circuit board via a single wire. The present invention eliminates data modulation of the system clock and minimizes signal-dependent EMI. Further, the present invention eliminates the need for header synchronization. In addition, the use of PDWM improves PCB signal routing flexibility while removing the need for a PLL circuit. Other advantages will be recognized by those of ordinary skill in the art.

FIG. 2 is a timing diagram illustrating one example of a method for transmitting and receiving analog data in accordance with one embodiment of the invention. As an important feature, an analog signal, not shown, is received and converted into a pulse density modulated (PDM) SIGNAL 104. The analog signal is most preferably a HIFI audio signal with high dynamic range and low distortion requirements as described above. This analog signal is preferably converted to a PDM SIGNAL 104 by sigma-delta, analog-to-digital (A/D) conversion. The analog signal is preferably subjected to oversampling such that A/D converter samples the signal at a rate at least N-times greater than the sampling frequency, $f_s$, required to satisfy the Nyquist rate. In addition, the A/D converter preferably uses a delta-sigma technique whereby the analog signal is integrated by a summing (sigma) amplifier, plurality of summing amplifiers, and the output of the summing amplifier is then subjected to a one-bit comparator (delta). The output of the delta comparator is further fedback to the sigma integrator. The result is a bit stream at the over-sampled rate of N-times $f_s$, and representing the analog signal in a PDM encoded form as PDM SIGNAL 104. The PDM SIGNAL 104 is a single-bit digital signal, where the voltage level, high or low, encodes a digital level, "1" or "0," as shown.

As another important feature of the present invention, after the analog signal has been converted to the PDM SIGNAL 104, the PDM SIGNAL 104 is subjected to pulse width modulation (PWM) to form a pulse density width modulated (PDWM) SIGNAL 108. In PWM encoding, the digital bit levels, "1" or "0," are encoded into long or short pulses 110, respectively. The PERIOD of the resulting PDWM SIGNAL 108 is kept constant. The leading edges 116 of each pulse 110 are detected by receiving circuitry and the pulse PERIOD is calculated. Note that the "1" and "0" bit levels are encoded as a long pulse 110 that is greater than 50% of the PERIOD and a short pulse 110 that is less than 50% of the PERIOD, respectively. Alternatively, the "0" bit could be encoded with length greater than 50% and the "1" bit encoded with length less than 50%. By so encoding the digital bits, the received PDWM SIGNAL 108 can be reliably read using a SAMPLE PULSE 120, or other sampling signal, occurring at or near the midpoint (50% duty cycle) of the PERIOD. In practice, the leading edges 116 of the PDWM signal are detected and the time between these pulses is digitally averaged. By dividing this average PERIOD time in half, an optimal time is calculated for the SAMPLING PULSE 120.

The preferred embodiment of FIG. 2 illustrates PDWM encoding of a PDM SIGNAL 108 having first and second bit levels, "0" and "1," via short and long pulse widths, respectively. However, as a more general embodiment, a PDM signal having multiple bit levels may also be encoded as a PDWM signal. In such a case, the PDWM output would incorporate a discrete pulse width to encode each discrete bit level. For example, a two-bit PDM modulator output may output four distinct bit levels. A PDWM encoder would produce pulses having four distinct pulse lengths, each detectable by four falling edge locations. This scheme could be used, for example, to encode a stereo signal onto a single PDWM signal.

The PDWM SIGNAL 108 is shown with a PERIOD clock detectable from the PDWM SIGNAL 108 rising edge and occurring at regular time intervals while the PDWM SIGNAL 108 pulse width is defined by a falling edge 122. However, the reverse is also possible. Therefore, the PERIOD clock edge may be detectable on a negative edge of the PDWM SIGNAL 1-8, while the pulse width is defined on a positive edge.

The timing of leading edge 116 of the PDWM SIGNAL 108 is set by the transmitting clock. Further, the robustness or reliability with which this leading edge 116 is transmitted, received, and then accurately detected by a receiving IC depends, in part, on the slope of the leading edge 116. Generally, the sharper the leading edge 116, the more robust the PERIOD clock will be to environmental noise and distortion. Unfortunately, sharper leading edges 116 tend to emit more EMI at multiples of the clock frequency. However, as a very useful outcome of the present invention, the PDWM SIGNAL 108 only needs to be decoded digitally at the receiving end. While the leading edge in the prior art SPDIF protocol must be detected with high precision to recover the data clock, the detection requirements for the falling edge 122 of the PDWM SIGNAL 108 are much more relaxed. As a result, the falling edges 122 may be made smoother or less abrupt so that less audio signal dependent EMI is generated. In fact, the timing of the SAMPLE PULSE signal 120 provides substantial timing delays, TD1 and TD2, before the falling edges of the PDWM SIGNAL 108 for encoded "1" and "0" bits, respectively. The falling edges 122 of the PDWM SIGNAL 108 only require edge transitions sharp enough to insure that the eye diagram for the data remains open. Therefore, the falling edge 122 transition slopes may be slow enough to minimize EMI. Further, the PDWM SIGNAL 108 contains the encoded audio signal and the smeared quantization noise spectrum that arises from the PDM process but does not include frequency multiples of the audio signal. By contrast, the SPDIF protocol emits EMI at the clock frequency, multiple images of the audio frequency content, and other unrelated frequencies due to the transmission of headers.

In the present invention, the PERIOD clock is readily recoverable from the PDWM SIGNAL 108 by detecting leading edge 116 transitions. Therefore, there is no need for a PLL at the receiver IC as is needed in the SPDIF protocol because the PERIOD clock can be used directly as the clock reference to the DAC. Any environmental noise picked up by the clock will be reproduced by the DAC, but a multiple-bit DAC architecture will minimize this effect. The PDWM SIGNAL 108 can be easily sampled via a SAMPLE PULSE 120, or equivalent, by setting a sampling time threshold at the average of the clock PERIOD. Because the PDWM SIGNAL 108 is only 1-bit wide at the PERIOD clock rate, there is no requirement for synchronization to determine the word length or to mark the start of each word.

FIG. 3 is a schematic block diagram illustrating one example of an audio device 200 incorporating the method of transmitting and receiving analog data in accordance with one embodiment of the invention. The audio device 200 may be any suitable digital device with audio functionality including, but not limited to, a cellular telephone, an internet appliance, a laptop computer, a palmtop computer, a personal digital assistant, a digital entertainment device, a radio communication device, a mobile music playing device, a tracking device, a personal training device, or a combination thereof. The audio device 200 includes a first integrated circuit IC1 210, a second integrated circuit IC2 250, and a substrate PCB 205.

The first integrated circuit 210 includes a sigma-delta, A/D converter, SD A/D 218 capable of converting an analog signal HIFI ANALOG IN 234 into a pulse density modulated PDM signal HIFI PDM IN 236. The first IC 210 also includes a pulse density width modulator PDWM ENCODER 222 capable of encoding the HIFI PDM IN signal 236 into a PDWM signal HIFI PDWM 244. The HIFI PDWM signal 244 is encoded according to the protocol of the present invention as short and long pulse widths defining first and second bit levels. Leading edges of each pulse bound each pulse period. The first IC 210 may further include a DECIMATOR circuit 226, as known in the art, capable of down-sampling the HIFI PDM IN signal 236 from a high frequency rate of N-times $f_s$ to a frequency, such as $f_s$, or simply a lower multiple of $f_s$, that can be further digitally processed with circuits at a lower clocking rate. The DECIMATOR circuit 226 reduces sensitivity to timing noise in the clock edge when content is played back through a DAC. The DECIMATOR 226 output HIFI HI RES IN 240 may have a higher resolution (multiple data bits encoded in a single word). A HIFI HI RES IN signal 240 may be further processed by a digital signal processor (DSP) 230 or by other digital circuits.

The second IC 250 includes a DECODER 254 circuit capable of receiving the HIFI PDWM signal 244. The DECODER 254 further includes a PDWM DECODER 258 capable of decoding the HIFI PDWM signal 244 to recover the HIFI PDM OUT signal 278 according to the protocol of the present invention. The PDWM DECODER 258 is further described below. The DECODER 254 further may include a sigma-delta, single-bit, digital-to-analog converter SD D/A 262. The SD D/A is capable of converting the HIFI PDM OUT signal 278 to recover the analog signal as HIFI ANALOG OUT 282. The second IC 250 may further include a DECIMATOR circuit 266 capable of down-sampling the HIFI PDM OUT signal 278 from a high frequency rate of N-times $f_s$ to a frequency, such as $f_s$, or simply a lower multiple of $f_s$, that can be further digitally processed with circuits at a lower clocking rate. The DECIMATOR 266 output HIFI HI RES OUT 286 may have a higher resolution (multiple data bits encoded in a single word) than the HIFI PDM OUT signal 278. A HIFI HI RES OUT signal 286 may be further processed by a digital signal processor (DSP) 274 or another digital circuit. The second IC 250 may include a sigma-delta, multiple-bit, digital-to-analog converter MULTI-BIT SD D/A 270. The MULTI-BIT SD D/A 270 is capable of converting the HIFI HI RES OUT signal 286, which is a series of digital words, into an analog output signal HIFI ANALOG OUT 2 290.

The substrate 205 is preferably a printed circuit board (PCB). The substrate 205 is capable of providing mechanical support and electrical connectivity to components, such as the first and second ICs 210 and 250. The substrate 205 may be any technology known to the art, including but not limited to PCBs, printed wiring boards (PWBs), printed circuit assemblies (PCAs), hybrid (ceramic-based) boards, and multi-chip modules (MCMs). The substrate 205 is capable of supporting the first and second ICs 210 and 250 and of conducting the PDWM signal HIFI PDWM 244 between the first and second ICs, typically via a metal line or trace.

Figure 4:
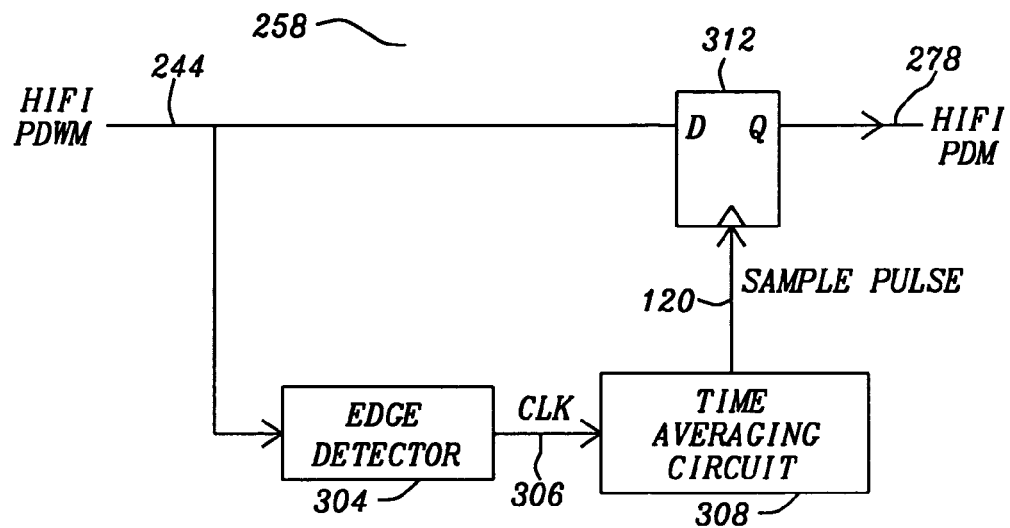
FIG. 4 is a schematic block diagram illustrating one example of a circuit device for receiving and decoding an encoded analog signal in accordance with one embodiment of the invention.

FIG. 4 is a schematic block diagram illustrating one example of a circuit device for receiving and decoding an encoded analog signal in accordance with one embodiment of the invention. In particular, an example of the DECODER circuit 258 is shown. The DECODER 258 includes an EDGE DETECTOR block 304, a TIME AVERAGING CIRCUIT 308, and a latch 312. The EDGE DETECTOR 304 is capable of detecting the leading pulse edges of the HIFI PDWM signal 244 and generating a CLK signal 306. The TIME AVERAGING CIRCUIT 308 is capable of calculating the length of each pulse period based on a detected CLK signal 306. The TIME AVERAGING CIRCUIT 308 is capable of generating a SAMPLE PULSE 120, or an equivalent signal, at near the midpoint of the pulse period. The latch 312, such as a D-type flip flop, is capable of sampling and holding the HIFI PDWM signal 244 at the SAMPLE PULSE 120 to decode a pulse density modulated signal HIFI PDM 278 from the pulse density width modulated signal HIFI PDWM 244.

Figure 5:
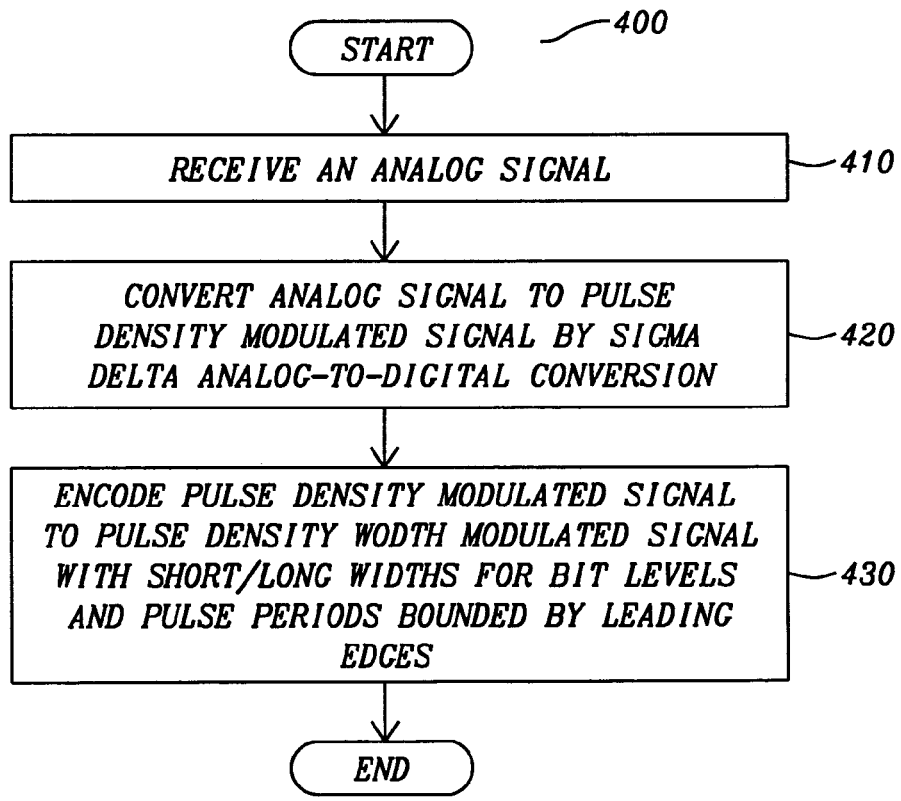
FIG. 5 is a flowchart illustrating one example of a method for encoding an analog signal into a pulse density width modulated signal in accordance with one embodiment of the invention.

FIG. 5 is a flowchart illustrating one example of a method 400 for encoding an analog signal into a pulse density width modulated signal in accordance with one embodiment of the invention. The flowchart method 400 shows operating steps performed by an audio device employing one example of a method of encoding an analog signal. In particular, one example of a method 400 performed by the audio device of FIG. 3 is shown. The process begins in step 410 where an analog signal HIFI ANALOG IN signal 234 is received. In step 420, the HIFI ANALOG IN signal 234 is converted to a pulse density modulated signal HIFI PDM IN 236 by sigma-delta, analog-to-digital conversion. In step 430, the HIFI PDM IN signal 236 is encoded to form a pulse density width modulated signal HIFI PDWM 244. Short and long pulse widths are defined for first and second bit levels. The leading edge of each pulse bounds each pulse period.

Figure 6:
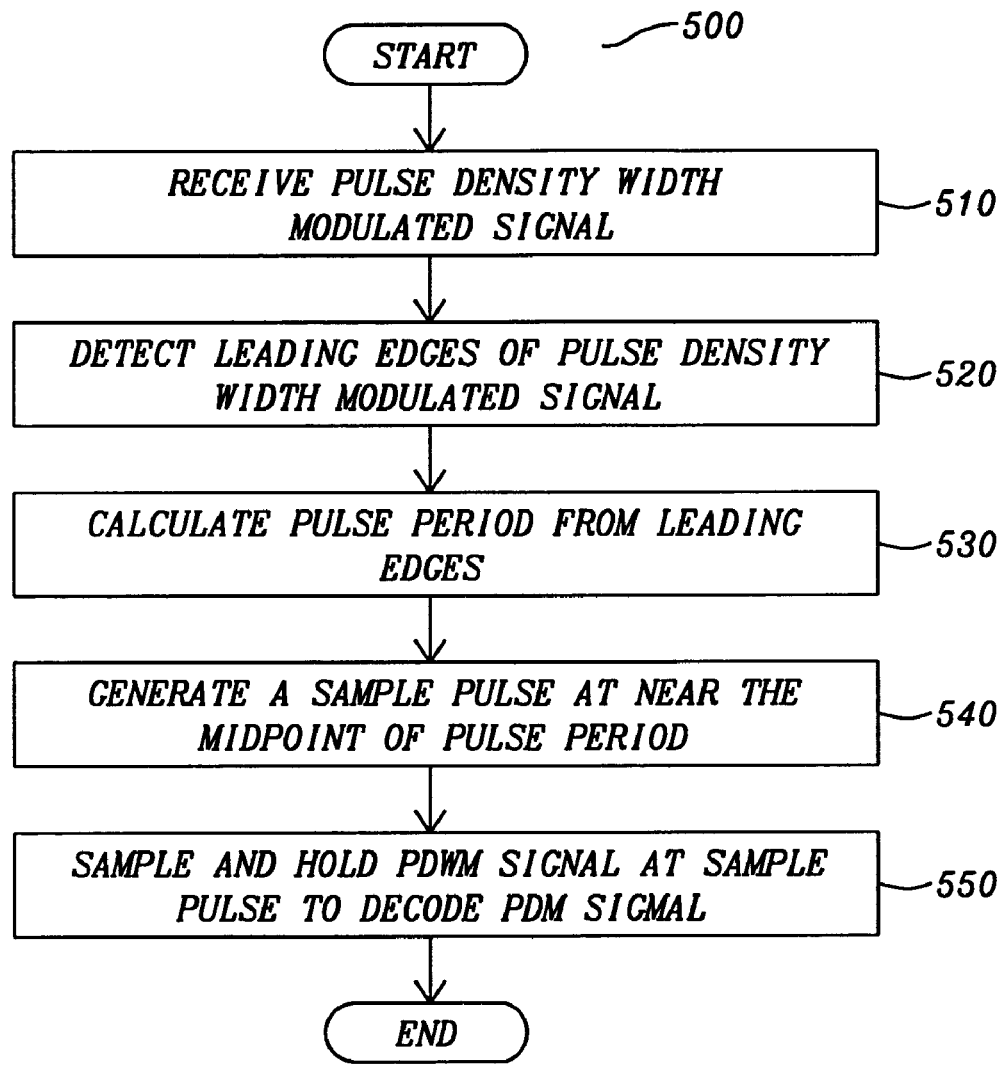
FIG. 6 is a flowchart illustrating one example of a method for decoding a pulse density modulated signal from a pulse density width modulated signal. in accordance with one embodiment of the invention.

FIG. 6 is a flowchart illustrating one example of a method 500 for decoding a pulse density modulated signal from a pulse density width modulated signal. in accordance with one embodiment of the invention. The flowchart method 500 shows operating steps performed by an audio device employing one example of a method of decoding a pulse density width modulation signal. In particular, one example of a method 500 performed by the audio device of FIG. 3 is shown. The process begins in step 510 where a pulse density width modulated signal HIFI PDWM 244 is received. In step 520, the leading pulse edges of the HIFI PDWM signal 244 is detected. In step 530, the pulse period is calculated from the leading pulse edges. In step 540, a sample pulse is generated at near the midpoint of the pulse period. In step 550, the pulse density width modulated signal HIFI PDWM 244 is sampled and held at the sample pulse to decode a pulse density modulated signal HIFI PDM OUT 278.

A novel and robust method to transmit HIFI analog signals over a single wire is described. The invention allows high-fidelity audio signals to be transmitted and received on a printed circuit board via a single wire. The present invention eliminates data modulation of the system clock and minimizes signal dependent EMI. Further, the present invention eliminates the need for header synchronization. In addition, the invention improves PCB signal routing flexibility while and removing the need for a phase-locked loop.

The PDWM scheme is superior to the SPDIF and I²S protocols. The transmitted signal is less susceptible to crosstalk, more flexible with respect to digital word lengths, and requires less overhead on the transmitting and receiving ICs. Overall, PDWM is a better candidate for the transmission and reception of high quality audio content over a single wire in densely populated and interference prone PCBs found in, for example, mass market audio and multimedia portable devices.

The above detailed description of the invention, and the examples described therein, has been presented for the purposes of illustration and description. While the principles of the invention have been described above in connection with a specific device, it is to be clearly understood that this description is made only by way of example and not as a limitation on the scope of the invention.

What is claimed is:
1. A method for encoding an analog signal, the method comprising:
    receiving an analog signal
    converting the analog signal into a pulse density modulated signal by sigma-delta, analog-to-digital conversion; and encoding the pulse density modulated signal into a pulse density width modulated signal having a plurality of discrete pulse widths corresponding to a plurality of pulse density modulated signal bit levels and wherein a leading edge of each pulse bounds each pulse period.

2. The method of claim 1 wherein said plurality of discrete pulse widths comprises short and long pulse widths and wherein the plurality of pulse density modulated signal bit levels comprises two bit levels.

3. The method of claim 1 wherein the leading pulse edge is a rising edge.

4. The method of claim 1 wherein the leading pulse edge is a falling edge.

5. A method for decoding a pulse density modulated signal from a pulse density width modulated signal, the method comprising:
   receiving a pulse density width modulated signal wherein short and long pulse widths define first and second bit levels and wherein a leading edge of each pulse bounds each pulse period;
   detecting the leading pulse edges of the pulse density width modulated signal;
   calculating the pulse period from the leading pulse edges;
   generating a sample pulse at near the midpoint of each pulse period; and
   sampling and holding the pulse density width modulated signal at the sample pulse to decode a pulse density modulated signal.

6. The method of claim 5 further comprising the step of processing the pulse density modulated signal in a sigma-delta, single-bit, digital-to-analog converter to thereby recover an analog signal digitally encoded therein.

7. The method of claim 5 further comprising the step of decimating the pulse density modulated signal to generate a multiple-bit resolution digital signal.

8. The method of claim 7 further comprising the step of processing the multiple-bit resolution digital signal in a sigma-delta, multiple-bit, digital-to-analog converter to thereby recover an analog signal digitally encoded therein.

9. A device enabled for encoding an analog signal, the device comprising:
   a sigma-delta, A/D converter operable to convert an analog signal into a pulse density modulated signal;
   a pulse density width modulator operable to encode the pulse density modulated signal into a pulse density width modulated signal having a plurality of discrete pulse widths corresponding to a plurality of pulse density modulated signal bit levels and wherein a leading edge of each pulse bounds each pulse period.

10. The device of claim 9 wherein said plurality of discrete pulse widths comprises short and long pulse widths and wherein the plurality of pulse density modulated signal bit levels comprises two bit levels.

11. The device of claim 9 wherein the leading pulse edge is a rising edge.

12. The device of claim 9 wherein the leading pulse edge is a falling edge.

13. An device enabled for receiving an encoded analog signal, the device comprising:
   a means to receive a pulse density width modulated signal wherein short and long pulse widths define first and second bit levels and wherein a leading edge of each pulse bounds each pulse period;
   an edge detector operable to detect the leading pulse edges of the pulse density width modulated signal;
   a time-averaging circuit operable to calculate each pulse period from the leading pulse edges and to generate a sample pulse at near the midpoint of each pulse period; and
   a latch operable to sample and hold the pulse density width modulated signal at the sample pulse to decode a pulse density modulated signal.

14. The device of claim 13 further comprising a sigma-delta, single-bit, digital-to-analog converter operable to recover an analog signal digitally encoded in a pulse density modulated signal.

15. The device of claim 13 further comprising a decimator operable to down-sample the pulse density modulated signal into a multiple-bit resolution digital signal.

16. The device of claim 15 further comprising a sigma-delta, multiple-bit, digital-to-analog converter operable to recover an analog signal digitally encoded in the multiple-bit resolution digital signal.

17. An audio device comprising:
   a first integrated circuit comprising:
      a sigma-delta, A/D converter operable to convert an analog signal into a pulse density modulated signal; and
      a pulse density width modulator operable to encode the pulse density modulated signal into a pulse density width modulated signal wherein short and long pulse widths define first and second bit levels and wherein a leading edge of each pulse bounds each pulse period;
   a second integrated circuit comprising:
   a means to receive the pulse density width modulated signal;
   an edge detector operable to detect the leading pulse edges of the pulse density width modulated signal;
   a time-averaging circuit operable to calculate each pulse period from the leading pulse edges and to generate a sample pulse at near the midpoint of each pulse period; and
   a latch operable to sample and hold the pulse density width modulated signal at the sample pulse to decode a pulse density modulated signal; and
   a substrate operable to support the first and second integrated circuits and to conduct the pulse density width modulated signal between the first and second integrated circuits.

18. The device of claim 17 wherein the analog signal is a high fidelity analog signal with useful components in the audio range.

19. The device of claim 17 wherein the leading pulse edge is a rising edge.

20. The device of claim 17 wherein the leading pulse edge is a falling edge.

21. The device of claim 17 wherein the second integrated circuit further comprises a sigma-delta, single-bit, digital-to-analog converter operable to recover an analog signal encoded in the pulse density modulated signal.

22. The device of claim 17 wherein the second integrated circuit further comprises a decimator operable to down-sample the pulse density modulated signal into a multiple-bit resolution digital signal.

23. The device of claim 22 wherein the second integrated circuit further comprises a sigma-delta, multiple-bit, digital-to-analog converter operable to recover an analog signal digitally encoded in the multiple-bit resolution digital signal.

24. The device of claim 17 wherein the first integrated circuit further comprises a digital signal processor.

25. The device of claim 17 wherein the second integrated circuit further comprises a digital signal processor.

* * * * *